United States Patent
Osman

(10) Patent No.: US 10,505,488 B2
(45) Date of Patent: Dec. 10, 2019

(54) SYSTEMS AND METHOD FOR CONTROLLING ELECTRODYNAMIC MACHINES WITH A VARIABLE FREQUENCY DRIVE

(71) Applicant: Siemens Aktiengesellschaft, München (DE)

(72) Inventor: Richard H. Osman, Pittsburgh, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 15/778,967

(22) PCT Filed: Jan. 13, 2017

(86) PCT No.: PCT/US2017/013287
§ 371 (c)(1),
(2) Date: May 24, 2018

(87) PCT Pub. No.: WO2017/123832
PCT Pub. Date: Jul. 20, 2017

(65) Prior Publication Data
US 2018/0351497 A1 Dec. 6, 2018

Related U.S. Application Data

(60) Provisional application No. 62/278,703, filed on Jan. 14, 2016.

(51) Int. Cl.
*H02P 27/04* (2016.01)
*H02P 21/28* (2016.01)
(Continued)

(52) U.S. Cl.
CPC .............. *H02P 27/04* (2013.01); *H02P 21/28* (2016.02); *H03L 7/08* (2013.01); *H02P 6/183* (2013.01)

(58) Field of Classification Search
CPC .......... H02P 27/04; H02P 21/28; H02P 21/00; H02P 6/183; H03L 7/08
(Continued)

(56) References Cited

U.S. PATENT DOCUMENTS

| 7,042,186 B2* | 5/2006 | Stancu | .................... H02P 6/183 318/609 |
| 8,134,316 B2* | 3/2012 | Osman | ..................... H02P 3/22 318/269 |
| 2009/0212724 A1 | 8/2009 | Osman et al. | |

FOREIGN PATENT DOCUMENTS

| CN | 103219731 A | 7/2013 |
| CN | 104811188 A | 7/2015 |

OTHER PUBLICATIONS

Mellouli Mohamed et al: "Comparative study between the improved schemes of MAF-based robust PLLs", 2015 International Conference on Sustainable Mobility Applications, Renewables and Technology (SMART), IEEE, Nov. 23, 2015 (Nov. 23, 2015), pp. 1-6, XP032858938, DOI: 10.1109/SMART.2015.7399224 / Nov. 23, 2015.

(Continued)

*Primary Examiner* — Bickey Dhakal
*Assistant Examiner* — Zemenay T Truneh

(57) ABSTRACT

Systems and method for controlling an alternating current (AC) electrodynamic machine (390) with a variable frequency drive (VFD) (380) include a control system (300) with a phase-locked-loop (PLL) circuit (382) for providing a stator flux angle signal (338) to the VFD (380), the PLL circuit (382) comprising a proportional integral (PI) regulator (332) providing an output signal (334); and a feedfor- (Continued)

ward generator (350) in communication with the PLL circuit (382), wherein the feedforward generator (350) tracks a stator flux position of the AC electrodynamic machine (390) such that the feedforward generator (350) determines a stator frequency signal (352) based on stator flux signals (308, 310, 312) and supplies the stator frequency signal (352) downstream of the PI regulator (332), and wherein the stator frequency signal (352) is summed with the output signal (334) of the PI regulator (332) to provide a dynamically adapted output signal (335) of the PI regulator (332), and wherein the adapted output signal (335) is used to determine the stator flux angle signal (338).

14 Claims, 2 Drawing Sheets

(51) Int. Cl.
  *H03L 7/08* (2006.01)
  *H02P 6/18* (2016.01)
(58) Field of Classification Search
  USPC .................................................. 318/808, 609
  See application file for complete search history.

(56) References Cited

OTHER PUBLICATIONS

Golestan Saeed et al: "Moving Average Filter Based Phase-Locked Loops: Performance Analysis and Design Guidelines" IEEE Transactions on Power Electronics, Institute of Electrical and Electronics Engineers, USA, vol. 29, No. 6, Jun. 1, 2014 (Jun. 1, 2014), pp. 2750-2763, XP011538429, ISSN: 0885-8993, DOI: 10.1109/TPEL. 2013.2273461 / Jun. 1, 2014.

Wang Jinyu et al: "A Method to Improve the Dynamic Performance of Moving Average Filter-Based PLL", IEEE Transactions on Power Electronics, Institute of Electrical and Electronics Engineers, USA, vol. 30, No. 10, Oct. 1, 2015 (Oct. 1, 2015), pp. 5978-5990, XP011582400, ISSN: 0885-8993, DOI: 10.1109/TPEL.2014. 2381673 / Oct. 1, 2015.

Iuna, citro, gavriluta, hermoso, candela: "Advanced PLL structures for grid synchronization in distributed generation", Internet European Association for theDevelopment of Renewable Energies, Environment andPower Quality (EA4EPQ), Mar. 30, 2012 (Mar. 30, 2012), Mar. 30, 2012 (Mar. 30, 2012), pp. 1747-1756, XP002769711 / Mar. 30, 2012.

Sun Le et al: "Design of the PLL for the speed sensorless stator-flux-oriented control of induction motors", 2015 18th International Conference on Electrical Machines and Systems (ICEMS), IEEE, Oct. 25, 2015 (Oct. 25, 2015), pp. 1913-1918, XP032851727, DOI: 10.1109/ICEMS.2015.7385353 / Oct. 25, 2015.

PCT International Search Report and Written Opinion of International Searching Authority dated May 12, 2017 corresponding to PCT International Application No. PCT/US2017/013287 filed Jan. 13, 2017.

\* cited by examiner

SYSTEMS AND METHOD FOR CONTROLLING ELECTRODYNAMIC MACHINES WITH A VARIABLE FREQUENCY DRIVE

CROSS REFERENCE TO RELATED APPLICATIONS

This Application is the U.S. National Stage of International Application No. PCT/US2017/013287 filed 13 Jan. 2017 and claims benefit thereof, the entire content of which is hereby incorporated herein by reference. The International Application No. PCT/US2017/013287 claims priority to U.S. Provisional Application No. 62/278,703 filed 14 Jan. 2016, the entire content of which is hereby incorporated herein by reference.

BACKGROUND

1. Field

Aspects of the present invention generally relate to electrodynamic machines, which include for example electric motors, such as alternating current (AC) asynchronous motors, for example induction motors, and AC synchronous motors, as well as electric generators, and more particularly to a system, apparatus and method for controlling an induction motor with a variable frequency drive (VFD).

2. Description of the Related Art

When starting large, e.g., medium voltage, AC motors via direct connection to a utility power source, one or more problems may occur. For example, a large AC motor may draw four to six times its rated current (known as inrush current) at a low power factor upon startup. This may cause significant transient voltage drops in the network of the utility power source, which may adversely affect other equipment and systems connected thereto. Also, the AC motor may undergo severe thermal and mechanical stress during a direct on-line start, which may shorten the life of the motor and/or limit the number of starts in a given period. Furthermore, during acceleration of a large AC motor, large torque pulsations may occur that can excite system torsional resonances that have been known on at least one occasion to cause a broken motor shaft.

To overcome the aforementioned problems, large AC motors may be "soft started" with a variable frequency drive (VFD). A VFD may controllably increase the magnitude and frequency of voltage applied to an AC motor during start-up. The voltage magnitude and frequency may start at very low values and may then increase to the rated voltage of the AC motor and to the frequency of the utility power source, e.g., 60 hertz, as the AC motor reaches its rated speed.

In order to provide a precision speed control of the AC motor, the VFD may comprise a control system with a phase-locked loop control circuit, herein also shortly referred to as PLL. Phase-locked-loop techniques are known and well suited to provide the precision speed control by phase locking the AC motor to a stable and accurate reference frequency. When the rate of change of frequency is very slow, for example less than 1 Hz per second, the dynamic accuracy of the PLL is acceptable. But when the frequency of the AC motor changes rapidly, for example 60 Hz per second, the dynamic accuracy of the PLL is not acceptable any more. Thus, a need may exist to provide an improved control system with a PLL for rapidly changing frequencies of an AC motor.

SUMMARY

Briefly described, aspects of the present invention generally relate to electrodynamic machines, which include for example electric motors, such as AC asynchronous motors, for example induction motors, and AC synchronous motors, as well as electric generators, and more particularly to systems and method for controlling an induction motor with a variable frequency drive (VFD).

A first aspect of the present invention provides a control system for controlling an alternating current (AC) electrodynamic machine comprising a phase-locked-loop (PLL) circuit for providing a stator flux angle signal to a variable frequency drive (VFD), the PLL circuit comprising a proportional integral (PI) regulator providing an output signal; and a feedforward generator in communication with the PLL circuit, wherein the feedforward generator tracks a stator flux position of the AC electrodynamic machine such that the feedforward generator determines a stator frequency signal based on stator flux signals and supplies the stator frequency signal downstream of the PI regulator, and wherein the stator frequency signal is summed with the output signal of the PI regulator to provide a dynamically adapted output signal of the PI regulator, and wherein the adapted output signal is used to determine the stator flux angle signal.

A second aspect of the present invention provides a system for controlling an alternating current (AC) electrodynamic machine comprising a variable frequency drive (VFD) configured to be coupled to a utility power source and to provide output currents; an AC electrodynamic machine operably coupled to a VFD output of the VFD, the VFD providing the output currents controlling magnitude of stator flux and torque produced by the AC electrodynamic machine, wherein the VFD further comprises a control system comprising a phase-locked-loop (PLL) circuit for providing a stator flux angle signal to the VFD, the PLL circuit comprising a proportional integral (PI) regulator providing an output signal; and a feedforward generator in communication with the PLL circuit, wherein the feedforward generator tracks a stator flux position of the AC electrodynamic machine such that the feedforward generator determines a stator frequency signal based on stator flux signals and supplies the stator frequency signal downstream of the PI regulator, and wherein the stator frequency signal is summed with the output signal of the PI regulator to provide a dynamically adapted output signal of the PI regulator, and wherein the adapted output signal is used to determine the stator flux angle signal.

A third aspect of the present invention provides a method for providing a feedforward signal for a phase-locked-loop (PLL) circuit comprising providing stator flux signals of an alternating current (AC) electrodynamic machine; determining zero crossings of the stator flux signals; generating a train of fixed width pulses derived from the zero crossings of the stator flux signals; and converting the train of fixed width pulses to a feedforward signal, wherein the feedforward signal is supplied to a PLL circuit, and wherein the feedforward signal is summed with an output signal of the PLL circuit to provide an adapted output signal.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Large (alternating current) AC motors may include medium voltage AC motors, which may have a rated voltage ranging from about 600 V (volts) AC to about 15,000 V (or 15 kV) AC. The "rated voltage" of a motor is a standardized term established by the National Electrical Manufacturers Association (NEMA) that generally refers to a motor's operating voltage usually +/−10%. Large AC motors may also include high voltage AC motors and, in some cases, other types of AC motors that may have a rated voltage below the above voltage range for medium voltage AC motors.

The aforementioned problems of starting a large AC motor may be overcome by "soft starting" the AC motor with a variable frequency drive (VFD). A VFD may initially apply to an AC motor at startup a low or near-zero voltage having a low or near-zero frequency. As the AC motor speed reaches its rated speed, the VFD may controllably increase both the voltage magnitude and frequency to the AC motor's rated voltage and a utility power source's frequency. At about that point, power supplied to the AC motor may be switched from the VFD directly to the utility power source.

Figure 1:
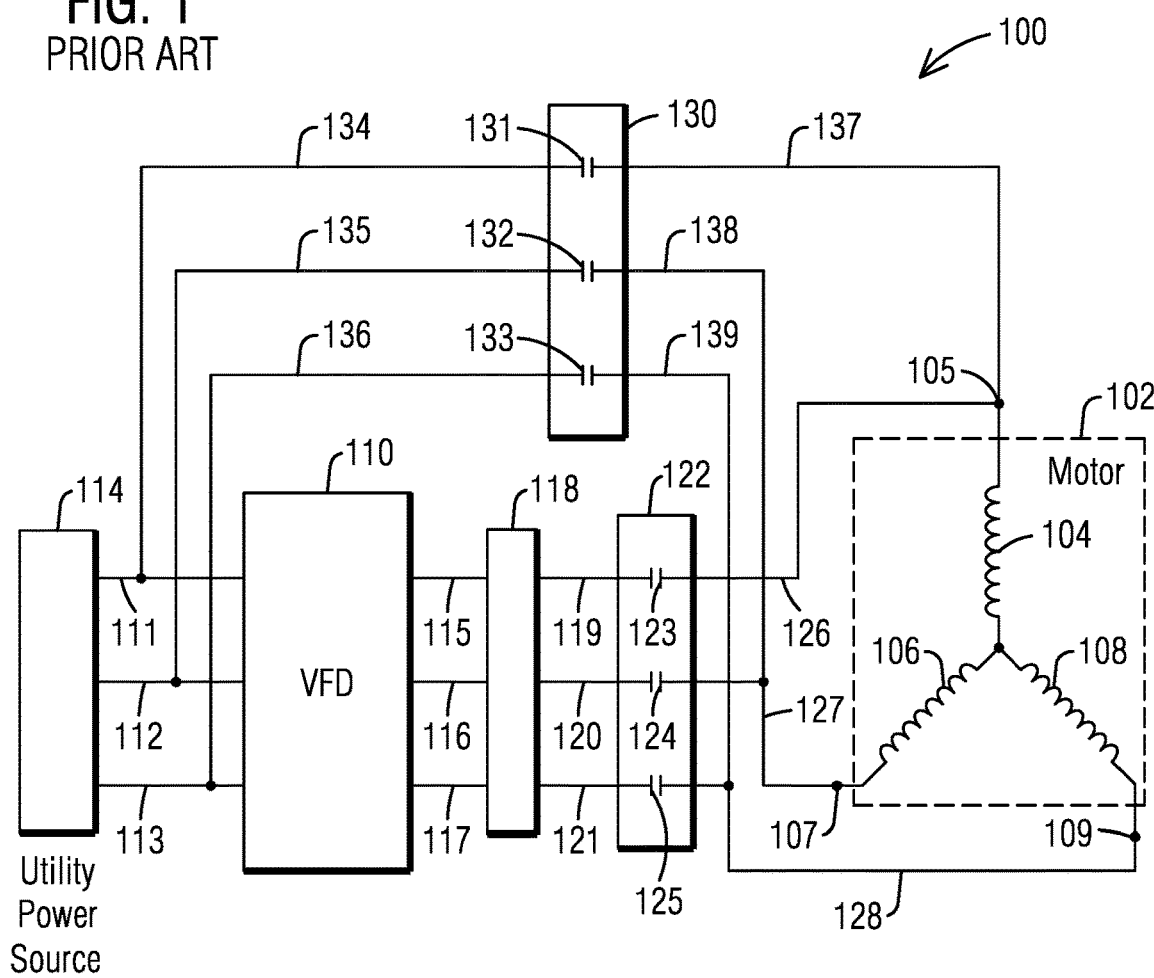
FIG. 1 illustrates a schematic diagram of a known system for starting large AC (alternating current) motors with a variable frequency drive (VFD) in accordance with embodiments disclosed herein.

FIG. 1 illustrates an example of a known system 100 for starting a large AC motor 102 in accordance with embodiments disclosed herein. AC motor 102 may be a 3-phase medium voltage AC motor having a first winding 104, a second winding 106, and a third winding 108 arranged in a star or Y-connection configuration. First winding 104 may have a first lead winding connection 105. Second winding 106 may have a second lead winding connection 107, and third winding 108 may have a third lead winding connection 109. AC motor 102 may be coupled to a load (not shown), which may be, e.g., one or more compressors, pumps, fans, and/or other suitable equipment.

System 100 may also include a variable frequency drive (VFD) 110 and a reactor 118. VFD 110 may have a voltage rating that is the same or substantially the same as the rated voltage of AC motor 102. VFD 110 may be coupled to receive 3-phase power via conductors 111, 112, and 113 (one conductor per phase) from a utility power source 114. VFD 110 may be configured to output 3-phase power having a variable peak voltage magnitude and a variable frequency via conductors 115, 116, and 117 (one conductor per phase). Reactor 118, which may be a 3-phase reactor, may be coupled in series to VFD 110 via conductors 115, 116, and 117. Reactor 118 may provide inductance (which may add impedance) to the 3-phase output of VFD 110.

System 100 may further include a first contactor 122 and a second contactor 130. First contactor 122 may include a first control switch 123, a second control switch 124, and a third control switch 125 each coupled in series to reactor 118 via respective conductors 119, 120, and 121. First control switch 123 may also be coupled in series to first lead winding connection 105 via conductor 126. Second control switch 124 may also be coupled in series to second lead winding connection 107 via conductor 127, and third control switch 125 may also be coupled in series to third lead winding connection 109 via conductor 128.

Second contactor 130 may include a first control switch 131, a second control switch 132, and a third control switch 133 each coupled in series to utility power source 114 via respective conductors 134, 135, and 136 (one conductor per phase). First control switch 131 may be coupled in series to first lead winding connection 105 via conductor 137. Second control switch 132 may be coupled in series to second lead winding connection 107 via conductor 138, and third control switch 133 may be coupled in series to third lead winding connection 109 via conductor 139.

First contactor 122 and second contactor 130 may be controlled by VFD 110. That is, VFD 110 may control the opening and closing of first, second, and third control switches 123, 124, and 125 to connect and disconnect the output voltage of VFD 110 to and from AC motor 102. Similarly, VFD 110 may control the opening and closing of first, second, and third control switches 131, 132, and 133 to connect and disconnect utility power of utility power source 114 to and from AC motor 102. Each of conductors 111-113, 115-117, 119-121, 126-128, 134-136, and 137-139 may be an electrical wire or cable of suitable gauge and/or size.

To start up AC motor 102, system 100 may operate as follows: Upon or prior to startup, VFD 110 may cause first contactor 122 to connect the variable voltage output of VFD 110 (via reactor 118) to AC motor 102, while VFD 110 may cause second contactor 130 to disconnect utility power (received from utility power source 114) from AC motor 102. That is, first, second, and third control switches 123, 124, and 125 of first contactor 122 may be closed by VFD 110, while first, second, and third control switches 131, 132, and 133 of second contactor 130 may be opened by VFD 110. VFD 110, which may receive 3-phase power from utility power source 114, may then initially provide a low or near-zero voltage having a low or near-zero frequency to each of first, second, and third lead winding connections 105, 107, and 109 (separated by appropriate phase angles) via respective conductors 126, 127, and 128. The application of voltage to AC motor 102 may cause the rotor (not shown) of AC motor 102 to begin rotating (in other words, the speed of AC motor 102 begins to increase from zero). The speed of AC motor 102 may be monitored by VFD 110 via feedback of, e.g., motor voltage and motor current. As the initial speed of AC motor 102 is sensed, VFD 110 may gradually and controllably increase both the output voltage peak magnitude and frequency. As the speed of AC motor 102 continues to increase, so too does the output voltage peak magnitude and frequency provided by VFD 110.

As the motor speed reaches the rated speed of AC motor 102, the voltage peak magnitude and frequency provided by VFD 110 may be at or near the voltage rating of the VFD 110

(i.e., at or near the rated voltage of AC motor 102) and the frequency of utility power source 114 (which may be, e.g., 60 hertz). At about this point, power provided to AC motor 102 may be switched from VFD 110 to utility power source 114. VFD 110 may cause second contactor 130 to connect utility power (received from utility power source 114) to AC motor 102, while VFD 110 may cause first contactor 122 to disconnect the variable output voltage of VFD 110 (via reactor 118) from AC motor 102. That is, first, second, and third control switches 123, 124, and 125 of first contactor 122 may be opened by VFD 110, while first, second, and third control switches 131, 132, and 133 of second contactor 130 may be closed by VFD 110. In some cases, AC motor 102 may be momentarily coupled to both VFD 110 and utility power source 114. Reactor 118 may limit current exchanged between VFD 110 and utility power source 114 in this situation. To ensure that VFD 110 may be able to startup and drive AC motor 102 to its rated speed, VFD 110 may have a voltage rating that is the same or substantially the same as the rated voltage of AC motor 102. For example, if the rated voltage of AC motor 102 is 6.9 kV AC, the voltage rating of VFD 110 may be about 6.9 kV AC.

Figure 2:
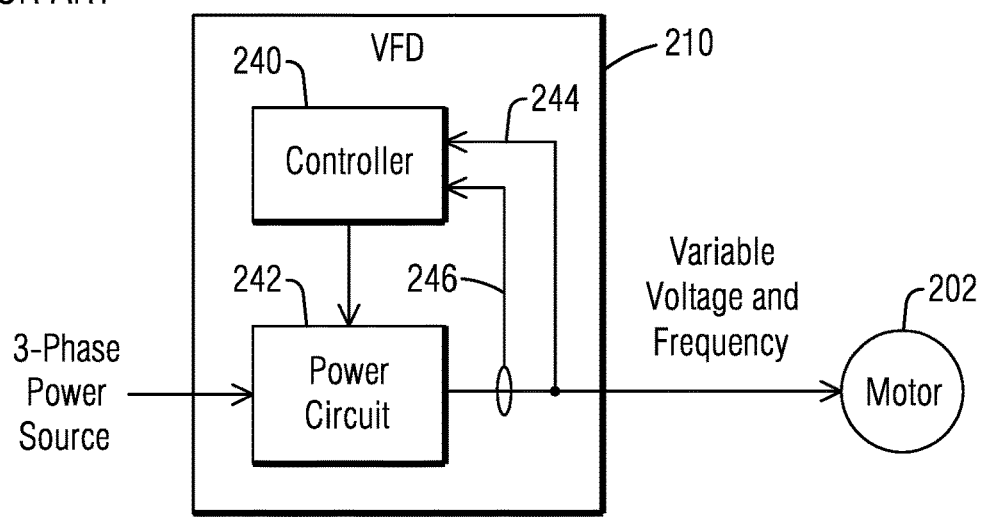
FIG. 2 illustrates a schematic diagram of a known VFD in accordance with embodiments disclosed herein.

FIG. 2 illustrates a schematic diagram of a known VFD 210 in accordance with embodiments disclosed herein. In some embodiments, VFD 110 may have a configuration similar or identical to a VFD 210 of FIG. 2. VFD 210 may output a voltage having a magnitude and frequency that may vary. The frequency may vary, e.g., from 0 up to the frequency of the AC input line which, as shown, may be from a 3-phase power source and may be, e.g., 60 hertz. The voltage magnitude may vary, e.g., from 0 up to about the voltage rating of VFD 210. VFD 210 may include a controller 240 and a power circuit 242. Controller 240 may control the operation of power circuit 242 and may be coupled to motor voltage feedback line 244 and motor current feedback line 246. Voltage feedback line 244 and current feedback line 246 may be coupled to AC motor 202. Controller 240 may monitor voltage feedback line 244 and current feedback line 246 to determine the speed of AC motor 202 and consequently determine whether to adjust the output voltage magnitude and frequency, for example in accordance with programming (e.g., a motor model) stored in and/or executing on controller 240. In some embodiments, controller 240 may include a microprocessor or other suitable CPU (central processing unit) and a memory for storing software routines to determine motor speed and the criteria for varying the output voltage magnitude and frequency. Alternatively, controller 240 may transmit feedback information to another component (not shown) and receive commands from that component regarding adjustments to the output voltage magnitude and frequency. In some embodiments, power circuit 242 may convert received AC line voltage to a DC voltage and then invert the DC voltage back to a pulsed DC voltage whose RMS (root mean square) value simulates an AC voltage. In some embodiments, power circuit 242 may include a rectifier, an inverter, and/or PWM (pulse width modulation) circuitry configured to vary the output voltage of VFD 210.

Figure 3:
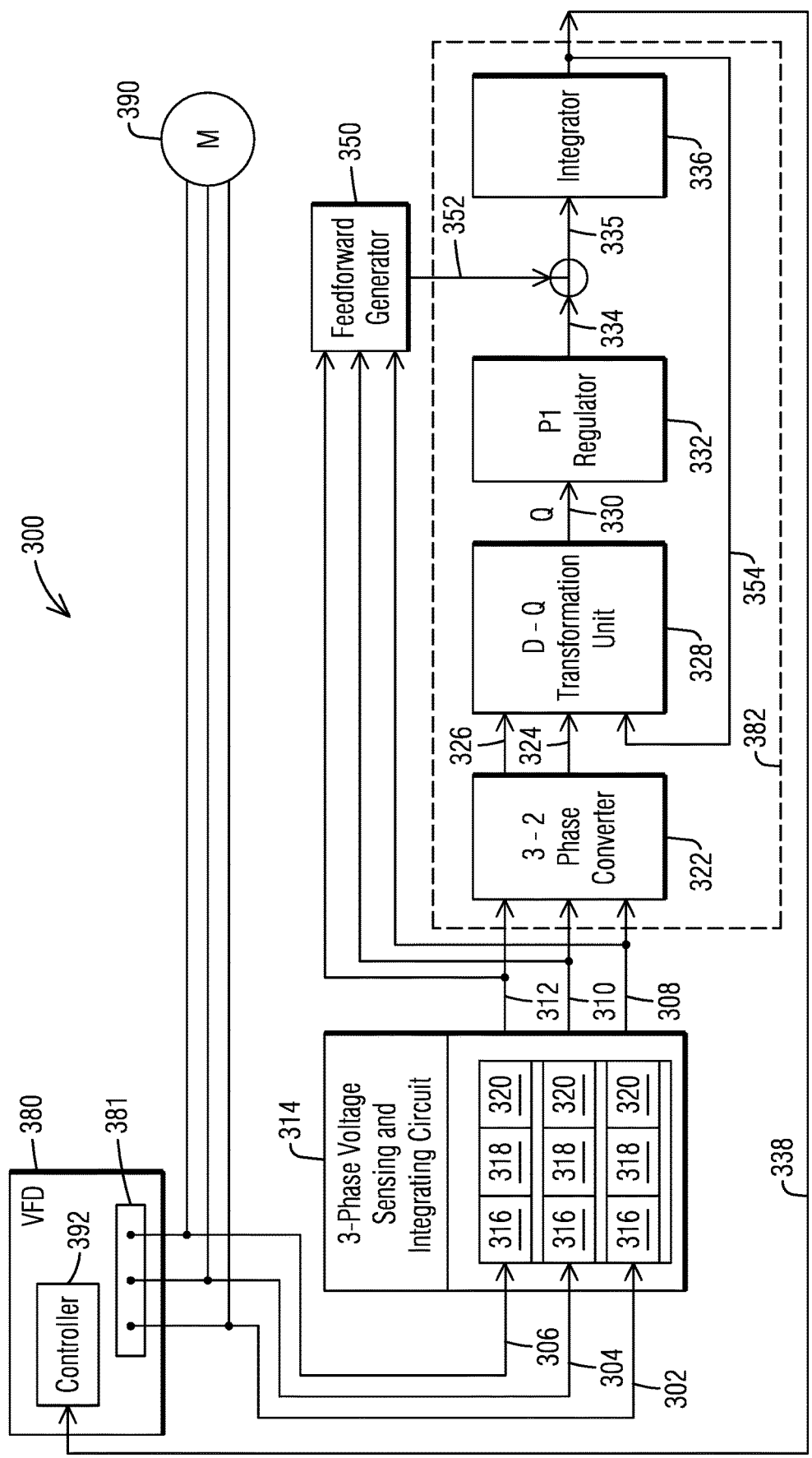
FIG. 3 illustrates a schematic diagram of a control system of a VFD including a feedforward signal for a phase-locked loop (PLL) circuit in accordance with an exemplary embodiment of the present invention.

FIG. 3 illustrates a schematic diagram of a control system 300 of a VFD 380 including a feedforward scheme for a phase-locked loop (PLL) circuit 382 in accordance with an exemplary embodiment of the present invention. VFD 380 comprises VFD output 381, wherein the VFD 380 of FIG. 3 may be configured similar to the VFD 210 of FIG. 2. VFD 380 of FIG. 3 and VFD 210 of FIG. 2 may be configured as described for example in U.S. Pat. No. 5,625,545 to Hammond which is incorporated herein in its entirety.

In order to provide a precision speed control of an AC motor 390, the VFD may comprise a control system 300 with a phase-locked loop control circuit 382, herein also shortly referred to as PLL circuit 382. The control system 300 may be part of a power circuit controlled by a controller 392 of VFD 380 as illustrated for example in FIG. 2 and FIG. 3. Phase-locked-loop techniques are well suited to provide the precision speed control by phase locking the AC motor 390 to a stable and accurate reference frequency. When a rate of change of frequency of the AC motor 390 is very slow, for example less than 1 Hz per second, a dynamic accuracy of the PLL circuit 382 is acceptable. But when the frequency of the AC motor 390 changes rapidly, for example 60 Hz per second, the dynamic accuracy of the PLL circuit 382 may not be acceptable since the PLL circuit 382 includes an error actuated signal (dynamic error) as will be described later. The control system 300 comprises a feedforward scheme that generates a feedforward signal which increases the dynamic accuracy and decreases a dynamic error of the PLL circuit 382 which is used to track a stator flux position in the AC motor 390, where the frequency of the AC motor 390 is increasing very rapidly.

With reference to FIG. 3, a three-phase voltage output signal across lines 302, 304, 306 is generated by variable frequency drive (VFD) 380, illustrated as VFD output 381. The 3-phase output signal across lines 302, 304, 306 is scaled down and integrated to create stator flux signals 308, 310, 312 for each phase (3-phase stator flux signal) via 3-phase voltage sensing and integrating circuit 314. The 3-phase output signal of the VFD 380 is scaled down and integrated using for example multiple comparators 316, operational amplifiers (op amps) 318 and integrators 320 to generate the stator flux signals 308, 310, 312. It should be noted that the comparators 316, op amps 318 and integrators 320 are only shown schematically. The 3-phase voltage sensing and integrating circuit 314 may comprise more, less or different electronic components since there may be alternative configurations for the voltage sensing and integrating circuit 314 to create the stator flux signals 308, 310, 312. As noted before, the provided control system 300 is specifically designed for AC motors, where the rate of change of frequency is high, for example 60 Hz per second. Therefore, the voltage output signal across lines 302, 304, 306 comprises a corresponding rapidly changing frequency (high df/dt).

The generated stator flux signals 308, 310, 312 are fed to the PLL circuit 382. It should be noted that one of ordinary skill in the art is familiar with PLL techniques, which are also described in various publications. Within the PLL circuit 382, the 3-phase stator flux signal 308, 310, 312 is converted into a 2-phase stator flux signal with stator flux signals 324, 326 by a 3-to-2 phase converter 322.

A direct quadrature (D-Q) transformation is performed of the 2-phase stator flux signal 324, 326 by a D-Q transformation unit 328. The 3-to-2 phase conversion by converter 322 is necessary before the D-Q transformation because the D-Q transformation unit 328 receives as third input signal the output signal (feedback) 354 of the PLL circuit 382. Direct Quadrature (D-Q) transformation is a mathematical transformation used to simplify the analysis of a three phase circuit. In the case of balanced three phase circuits, application of D-Q transformation reduces the three AC quantities to two quantities. Simplified calculations can be carried out on these imaginary quantities before performing the inverse transformation to recover the actual 3 phase AC results. As is known, a three-phase AC motor may be mathematically represented as a two-phase AC motor with two axes of magnetic symmetry using D-Q transformation. The axis in which magnetic flux is generated is known as the direct axis (D-axis). The axis perpendicular to the direct axis is known as the quadrature axis (Q-axis).

After performance of the D-Q transformation, a proportional integral (PI) regulator 332 is fed from the Q-output 330 of the D-Q transformation unit 328. Only the portion of the Q-axis is fed to the PI regulator 332. The PI regulator 332, also referred to as PI controller, continuously calculates an error value as the difference between a desired set point and a measured process variable and applies a correction based on proportional and integral terms. With the PI regulator 332, the Q-portion of the D-Q transformation is regulated to zero, so that a stator flux is aligned entirely along the D-axis. An output 334 of the PI regulator 332 represents an angular frequency of the stator flux signals 324, 326, which is forwarded to an integrator 336 which integrates the angular frequency to a stator flux angle signal 338. The stator flux angle signal 338 represents an output signal (feedback) of the PLL circuit 382 which is supplied to the VFD 380. The stator flux angle signal 338 is also fed back to the D-Q transformation unit 328 as feedback signal 354 so that the stator flux angle is dynamically calculated and adapted. The purpose of the PLL circuit 382 is to lock onto the position of the motor stator flux of the AC motor 390 and provide the stator flux angle signal 338 to the VFD 380, in particular to the controller 392 of the VFD 380, so that the controller 392 causes the VFD 380 to generate currents in the D- and Q-axes as identified by the PLL circuit 382. Current of the D-axis controls the magnitude of the stator flux, and current of the Q-axis controls the magnitude of torque produced by the AC motor 390.

Because the angular frequency provided by the PI regulator 336 is an error actuated signal, there may be a dynamic error in the stator flux angle signal 338 of the integrator 336 which becomes zero when the angular frequency is not changing, or only changing slowly. But when the angular frequency is changing rapidly, the error in the stator flux angle signal 338 can grow too large. The control system 300 as described herein provides means to reduce the dynamic error in the stator flux angle signal 338. In order to reduce the error, a feedforward generator 350 supplies a frequency signal 352 downstream of the PI regulator 332 for reducing the error.

The feedforward generator 350 provides an independent means for determining a stator frequency of the AC motor 390. As described before, the 3-phase output signal across lines 302, 304, 306 is scaled down and integrated to create a 3-phase stator flux signal 308, 310, 312, which are then processed in the PLL circuit 382. In parallel, the stator flux signals 308, 310, 312 are also supplied to the feedforward generator 350. In turn, the feedforward generator 350 supplies a stator frequency signal 352 downstream of the PI regulator 332, where the frequency signal 352 is summed with the output 334 of the PI regulator 332. Thus, an adapted output signal 335 of the PI regulator 332 is provided which represents an adapted angular frequency of the stator flux signals 308, 310, 312, 324, 326.

By providing an independent frequency signal 352 of the AC motor 390, in particular a stator frequency signal, the dynamic error in the stator flux angle signal 338 of the integrator 336 is reduced because the feedforward generator 350 continuously provides a signal of the current stator frequency of the AC motor 390. Thus, the PLL circuit 382 receives current stator frequency input and the stator flux angle signal 338 calculated by the integrator 336 is adapted or modified according to the present stator frequency of the AC motor 390.

The stator frequency signal 352 is derived by converting a pulse train, derived from flux signals zero crossings, to an analog signal, using for example pulse width modulation (PWM). Specifically, the feedforward generator 350 determines zero crossings of the flux signals 308, 310, 312 and generates a train of width pulses, wherein a repetition rate is proportional to the stator frequency. The train of width pulses is then filtered and/or converted into the analog frequency signal 352 using for example PWM.

Simulation results show that having the feedforward signal 352 of the feedforward generator 350 significantly improves the dynamic accuracy of the stator flux position signal 338. Improving the accuracy of the flux position signal 338 improves the performance of the VFD 380 for highly dynamic drive systems where speed (frequency) is changing rapidly. In addition, proportional and integral gains of the PI regulator 332 may be increased which will also decrease the error in the stator flux angle signal 338, but this approach may be limited by stability concerns.

The described control system 300 including the PLL circuit 382 and feedforward generator 350 includes logic which may be implemented in hardware, software or a combination thereof and may be used in connection with rotating AC electrodynamic machines as well as linear electrodynamic machines, for example linear AC motors.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

The invention claimed is:

1. A control system for controlling an alternating current (AC) electrodynamic machine comprising:
   a phase-locked-loop (PLL) circuit for providing a stator flux angle signal to a variable frequency drive (VFD), the PLL circuit comprising a proportional integral (PI) regulator providing an output signal; and
   a feedforward generator in communication with the PLL circuit,
   wherein the feedforward generator tracks a stator flux position of the AC electrodynamic machine such that the feedforward generator determines a stator frequency signal based on stator flux signals and supplies the stator frequency signal downstream of the PI regulator,
   wherein the stator frequency signal is summed with the output signal of the PI regulator to provide a dynamically adapted output signal of the PI regulator,
   wherein the adapted output signal is used to determine the stator flux angle signal, and
   wherein the feedforward generator derives the stator frequency signal by converting a pulse train, derived from zero crossings of the stator flux signals, to an analog signal.

2. The control system of claim 1, wherein the output signal of the PI regulator represents an angular frequency of the stator flux signals which is summed with the stator frequency signal of the feedforward generator providing the dynamically adapted output signal of the PI regulator representing an adapted angular frequency of the stator flux signal.

3. The control system of claim 1, wherein the PLL circuit further comprises an integrator operably coupled to the PI regulator, wherein the integrator integrates the adapted output signal of the PI regulator to the stator flux angle signal.

4. The control system of claim 1, wherein the zero crossings of the stator flux signals are converted to an analog signal using pulse width modulation (PWM), wherein a repetition rate of the pulse train is proportional to a stator frequency of the AC electrodynamic machine.

5. The control system of claim 1, wherein the PLL circuit is in communication with a controller of the VFD and transmits the stator flux angle signal to the controller, wherein the controller controls the VFD such that the VFD generates output currents based on the stator flux angle signal.

6. The control system of claim 5, wherein the PLL circuit further comprises a direct quadrature (D-Q) transformation unit for transforming and identifying a D-axis and a Q-axis of the stator flux signals, wherein the controller is configured to cause the VFD to generate the output currents in accordance with the D-axis and Q-axis, wherein current of the D-axis controls a magnitude of stator flux, and current of the Q-axis controls magnitude of torque produced by the AC electrodynamic machine.

7. A system for controlling an alternating current (AC) electrodynamic machine comprising:
   a variable frequency drive (VFD) configured to be coupled to a utility power source and to provide output currents;
   wherein the AC electrodynamic machine is operably coupled to a VFD output of the VFD, the VFD providing the output currents controlling magnitude of stator flux and torque produced by the AC electrodynamic machine,
   wherein the VFD further comprises a control system comprising:
      a phase-locked-loop (PLL) circuit for providing a stator flux angle signal to the VFD, the PLL circuit comprising a proportional integral (PI) regulator providing an output signal; and
      a feedforward generator in communication with the PLL circuit, wherein the feedforward generator tracks a stator flux position of the AC electrodynamic machine such that the feedforward generator determines a stator frequency signal based on stator flux signals and supplies the stator frequency signal downstream of the PI regulator,
   wherein the stator frequency signal is summed with the output signal of the PI regulator to provide a dynamically adapted output signal of the PI regulator,
   wherein the adapted output signal is used to determine the stator flux angle signal, and
   wherein the feedforward generator derives the stator frequency signal by converting a pulse train, derived from flux signals zero crossings of the stator flux signals, to an analog signal using pulse width modulation (PWM).

8. The system of claim 7, wherein the AC electrodynamic machine is configured as linear AC induction motor.

9. The system of claim 7, wherein the output signal of the PI regulator represents an angular frequency of the stator flux signals which is summed with the stator frequency signal of the feedforward generator providing an adapted output signal of the PI regulator representing an adapted angular frequency of the stator flux signals.

10. The system of claim 7, wherein the PLL circuit further comprises an integrator operably coupled to the PI regulator, wherein the integrator integrates the adapted output signal of the PI regulator to the stator flux angle signal.

11. The system of claim 7, wherein the PLL circuit is in communication with a controller of the VFD and transmits the stator flux angle signal to the controller, wherein the controller controls the VFD such that the VFD generates output currents in accordance with the stator flux angle signal.

12. A method for providing a feedforward signal for a phase-locked-loop (PLL) circuit comprising:
   providing stator flux signals of an alternating current (AC) electrodynamic machine;
   determining zero crossings of the stator flux signals;
   generating a train of fixed width pulses derived from the zero crossings of the stator flux signals; and
   converting the train of fixed width pulses to a feedforward signal, wherein the feedforward signal is supplied to the PLL circuit comprising a proportional integral (PI) regulator, and wherein the feedforward signal is summed with an output signal of the PI regulator of the PLL circuit to provide an adapted output signal of the PI regulator, the adapted output signal of the PI regulator being used to determine a stator flux angle signal for a variable frequency drive (VFD).

13. The method of claim 12, wherein the feedforward signal comprises a stator frequency signal of the AC electrodynamic machine, wherein the output signal represents an angular frequency of the stator flux signals provided by a proportional integral (PI) regulator, and wherein the output signal is summed with the feedforward signal to provide an adapted angular frequency of the stator flux signal.

14. The method of claim 12, wherein the PLL circuit further comprises an integrator operably coupled to the PI regulator, wherein the integrator integrates the adapted output signal of the PI regulator to a stator flux angle signal supplied to a variable frequency drive (VFD) controlling the AC electrodynamic machine.

* * * * *